(12) United States Patent
Chaudhari et al.

(10) Patent No.: US 12,628,472 B2
(45) Date of Patent: May 12, 2026

(54) LIGHT EMITTING DEVICE

(71) Applicant: BALDR LIGHT APS, Hørsholm (DK)

(72) Inventors: Ashok Chaudhari, Croton-on-Hudson, NY (US); Lars Frederiksen, Gentofte (DK); Ratnakar D. Vispute, Columbia, MD (US)

(73) Assignee: BALDR LIGHT APS, Hørsholm (DK)

( * ) Notice: Subject to any disclaimer, the term of this patent is extended or adjusted under 35 U.S.C. 154(b) by 424 days.

(21) Appl. No.: 18/549,725

(22) PCT Filed: Mar. 9, 2022

(86) PCT No.: PCT/DK2022/050041
§ 371 (c)(1),
(2) Date: Sep. 8, 2023

(87) PCT Pub. No.: WO2022/188937
PCT Pub. Date: Sep. 15, 2022

(65) Prior Publication Data
US 2024/0162384 A1 May 16, 2024

(30) Foreign Application Priority Data

Mar. 9, 2021 (DK) ............................ PA 2021 70105
Jul. 20, 2021 (DK) ............................ PA 2021 70389

(51) Int. Cl.
*H10H 20/823* (2025.01)
*H10H 20/00* (2025.01)
(Continued)

(52) U.S. Cl.
CPC ........ *H10H 20/823* (2025.01); *H10H 20/052* (2025.01); *H10H 20/821* (2025.01); *H10H 20/81* (2025.01)

(58) Field of Classification Search
CPC .. H10H 20/823; H10H 20/052; H10H 20/821; H10H 20/81; H10H 20/831
See application file for complete search history.

(56) References Cited

U.S. PATENT DOCUMENTS 5,861,636 A 1/1999 Dutta et al.
9,856,578 B2 1/2018 Vispute et al.
(Continued)

FOREIGN PATENT DOCUMENTS

CN 105336820 A 2/2016
EP 1383177 A1 1/2004
(Continued)

OTHER PUBLICATIONS

Ishii , et al., Applied Physics Express, vol. 12, No. 052011, 2019, 6 Pages.
(Continued)

*Primary Examiner* — Mohammad A Rahman
(74) *Attorney, Agent, or Firm* — Flaster Greenberg P.C.

(57) ABSTRACT

The present invention relates to a light emitting device comprising a first main layer of an electrically conducting material, a second main layer of an electrically conducting material and a light emitting unit between the first main layer and the second main layer, wherein the light emitting unit comprises a light emitting layer, and wherein the first main layer and/or the second main layer has a light exit orifice aligned with a section of the light emitting layer. The light emitting device can utilise impact ionisation to emit UV-C light.

17 Claims, 3 Drawing Sheets

(51) Int. Cl.
  *H10H 20/81* (2025.01)
  *H10H 20/821* (2025.01)

(56) References Cited

U.S. PATENT DOCUMENTS

| | | | |
|---|---|---|---|
| 10,978,290 B1 | 4/2021 | Coe-Sullivan et al. | |
| 11,462,400 B1 | 10/2022 | Atanackovic | |
| 11,462,658 B2 | 10/2022 | Krause et al. | |
| 2005/0035354 A1 | 2/2005 | Lin et al. | |
| 2008/0007177 A1* | 1/2008 | Nishiaki | H01J 61/526 |
| | | | 313/623 |
| 2011/0127505 A1* | 6/2011 | Nakamura | H10K 50/17 |
| | | | 257/E33.001 |
| 2011/0215719 A1* | 9/2011 | Misawa | H01J 11/40 |
| | | | 313/586 |
| 2012/0091499 A1 | 4/2012 | Kitagawa et al. | |
| 2012/0112232 A1* | 5/2012 | Jeong | H10H 20/831 |
| | | | 257/E33.072 |
| 2016/0020353 A1 | 1/2016 | Chu | |
| 2017/0110046 A1* | 4/2017 | Kim | G09G 3/2007 |

| | | | |
|---|---|---|---|
| 2017/0250332 A1 | 8/2017 | Paulos | |
| 2022/0241444 A1 | 8/2022 | Igarashi et al. | |
| 2023/0013843 A1 | 1/2023 | Krause et al. | |

FOREIGN PATENT DOCUMENTS

| | | |
|---|---|---|
| JP | H04174567 A | 6/1992 |
| WO | 03081685 A1 | 10/2003 |
| WO | 2015104024 A1 | 7/2015 |
| WO | 2017121430 A1 | 7/2017 |
| WO | 2018077359 A1 | 5/2018 |
| WO | 2019243618 A1 | 12/2019 |

OTHER PUBLICATIONS

Kentaro, Kaneko , et al., Journal of Electronic Materials, vol. 47, No. 8, 2018.

Ni , et al., ACS Appl. Mater Interfaces, vol. 6, 2014, 8257-8262.

Zhuang , et al., Journal of Luminescence, vol. 187, 2017, 428-432.

Zhang, et al., Recent Advances in Flexible Alternating Current Electroluminescent Devices, APL Mater. vol. 9, No. 030701, 2021, 15 pages.

\* cited by examiner

LIGHT EMITTING DEVICE

CROSS-REFERENCE TO RELATED APPLICATIONS

This application is the 371 National Stage of International Application No. PCT/DK2022/050041, filed Mar. 9, 2022, which claims priority to Denmark Application No. PA 2021 70105, filed Mar. 9, 2021, and Denmark PA 2021 70389, filed Jul. 20, 2021, the disclosures of which are incorporated herein by reference in their entirety.

CROSS-REFERENCE TO RELATED APPLICATIONS

This application is the 371 National Stage of International Application No. PCT/DK2022/050041, filed Mar. 9, 2022, which claims priority to Denmark Application No. PA 2021 70105, filed Mar. 9, 2021, and Denmark PA 2021 70389, filed Jul. 20, 2021, the disclosures of which are incorporated herein by reference in their entirety.

FIELD OF THE INVENTION

The present invention relates to a light emitting device comprising a first main layer of an electrically conducting material, a second main layer of an electrically conducting material and a light emitting unit between the first main layer and the second main layer. The light emitting unit can be configured to provide UV-C light that is useful for sterilising surfaces and air.

BACKGROUND

Composite boards are well known construction elements for light emitting diode (LED) based lamps where two electrically conducting plates separated by an insulating material are used to supply electricity to and from LEDs mounted in the composite board. The composite board thus provides both support for the LEDs and also electricity via the conducting plates. For example, WO 2015/104024 discloses a construction element where an electronic component is connected to a composite board using an appropriate adapter. WO 2015/104024 also discloses transmission of data to an electronic component in the construction element using power line communication via the electrically conducting plates.

WO 2017/121430 and WO 2018/077359 disclose electrical supply systems where composite boards serve as electrical supply and extension modules for providing electricity, and data communication, to electronic components in the respective modules.

The systems of WO 2017/121430 and WO 2018/077359 and the construction element of WO 2015/104024 are useful in so-called "Internet of Things ("IoT") applications and provide flexibility for building IoT devices, but they do not generally provide functions beyond supplying electricity and data to electronic components in the respective composite boards.

Ultraviolet (UV) light is commonly used for sterilising treatments, and commercially available LEDs can provide UV wavelengths in the UV-A and UV-B ranges and as an example, WO 2019/243618 discloses a board where the electronic components are UV LEDs, which may be used for sterilisation.

Magnesium zinc oxide (MgZnO) is a material with an appropriate band gap energy for providing UV-C wavelengths as described by Ishii et al., 2019 (Applied Physics Express 12, 052011). However, MgZnO has not yet been employed in a practical setting for creating a lamp capable of UV sterilisation. The application of MgZnO for generation of UV light is reviewed by Lu et al. (Chin. Phys. B Vol. 26, No. 4, 2017, 047703). As explained by Lu et al., obtaining UV light with a wavelength below 300 nm is problematic, and although it has been suggested to use impact ionisation, the required high voltages produce heating that has made this approach impossible.

The above-mentioned systems all employ LEDs as individual units that are mounted on or in holes in the composite boards. The present inventors believe that composite boards may have further advantageous applications, and it is an object of the invention to provide a unit having further applications than suggested in the prior art. It is especially an aim to provide a UV lamp based on MgZnO, which is capable of providing sterilising UV-C light.

SUMMARY

A first aspect of the present invention relates to a light emitting device comprising a first main layer of an electrically conducting material, a second main layer of an electrically conducting material and a light emitting unit between the first main layer and the second main layer, wherein the light emitting unit comprises a light emitting layer, and wherein the first main layer and/or the second main layer has a light exit orifice aligned with a section of the light emitting layer.

The present light emitting device has a light exit orifice aligned with a section of the light emitting layer. The light exit orifice has an edge, or perimeter, and in particular, the perimeter may be a line, e.g. a continuous line, surrounding a section of the light emitting layer. Due to the alignment of the light emitting layer and the light exit orifice, the light emitting layer has a surface from which light emitted from the light emitting layer exits the light emitting device via the light exit orifice. The light emitting layer can be described to have a surface in the light exit orifice, and in general, the surface in the light exit orifice may be considered to have a centre point, which centre point has a minimum distance to the edge of the light exit orifice. However, depending on the shape of the light exit orifice, the light exit orifice may also have two or more, e.g. a plurality, centre points. In further examples, the light exit orifice may have a shape, e.g. a shape in the outer surface of the main layer having the light exit orifice, having a centre line.

The present inventors have now surprisingly found that an electric field generated by passing an electric current from the first main layer of an electrically conducting material to the second main layer of an electrically conducting material, or vice versa, activates the light emitting layer to generate light to be emitted from the light emitting device via the light exit orifice. The light emitting device especially allows that impact ionisation is employed to emit light, e.g. ultraviolet (UV) light, in particular UV-C light. Without being bound by theory, the present inventors believe that this effect is caused by the electrical field passing through the edge of the electrically conducting material via the light emitting layer to the electrically conducting material of the opposite main layer or vice versa. Thus, the light emitting device provides a simplified way to utilise impact ionisation to provide e.g. UV-C light in a practical design.

The effect is especially pronounced when the electrically conducting materials of the main layers are metals, e.g. aluminium, magnesium, or titanium. The effect is also particularly pronounced when the main layers are metallic and have thicknesses in the range of 0.5 mm to 5 mm, e.g. 1 mm to 3 mm. Thus, in an example, the first and the second main layers are made from aluminium, magnesium, or titanium, e.g. plates of aluminium, magnesium, or titanium, having thicknesses in the range of 0.5 mm to 5 mm, e.g. 1 mm to 3 mm. Being able to provide the main layers with large thicknesses, e.g. 0.5 mm and above, results in reduction of flexing of the main layers, and consequently, flexing of the light emitting unit. The light emitting layer is generally thin, e.g. of micrometre scale, and therefore it is particularly relevant to avoid flexing, since the risk of short-circuiting between the electrically conducting main layers can thereby be minimised.

Moreover, when the first and the second main layers are made from metals, especially aluminium, magnesium, orti-tanium, e.g. plates of aluminium, magnesium or titanium, and have thicknesses in the range of 0.5 mm to 5 mm, e.g. 1 mm to 3 mm, the metals provide a heat sink, which allows that sufficient heat is removed from the light emitting unit for the light emitting device to employ impact ionisation, e.g. when the light emitting layer comprises or consists of a single crystal of MgO, a layer of $Mg_xZn_{1-x}O$ with $0.6{\leq}x{\leq}1$, or a single crystal of MgO with a layer of $Mg_xZn_{1-x}O$ with $0.6{\leq}x{\leq}1$, to provide light, especially UV-C light. For example, the light emitting layer comprises or consists of a single crystal of MgO having a thickness between the first main layer and the second main layer in the range of 100 μm to 1000 μm, e.g. 400 μm to 600 μm, or the light emitting layer comprises or consists of a layer of $Mg_xZn_{1-x}O$ with $0.6{\leq}x{\leq}1$ having a thickness between the first main layer and the second main layer in the range of 100 nm to 500 nm. Thereby, the light emitting device having first and the second main layers made from metals with a thickness in the range of 0.5 mm to 5 mm allows utilising impact ionisation at a scale to provide a UV lamp of a sufficient size to deliver enough energy, i.e. via the light emitting unit, to sterilise a room, e.g. a surface in the room, such as a table surface or another furniture surface, or the air in the room.

The light emitting device comprises a first main layer of an electrically conducting material and a second main layer of an electrically conducting material. Each of the first main layer and the second main layer has an outer surface, e.g. the surface facing away from the light emitting unit, and the outer surfaces define a dimension between the outer surface of the first main layer and the outer surface of the second main layer, and the first main layer and the second main layer further define a dimension between the first main layer and the second main layer. The dimension between the outer surfaces and the dimension between the first main layer and the second main layer may also be referred to as thicknesses. Thus, the dimension between the outer surface of the first main layer and the outer surface of the second main layer represents a thickness of the light emitting device, and the dimension between the first main layer and the second main layer represents a thickness of the light emitting unit. Correspondingly, each of the first main layer and the second main layer may also be described to have a thickness, e.g. the dimension between the respective outer surfaces and the light emitting unit.

In order to further minimise the risk of short circuits between the first and the second main layers there may be an electrically insulating material between the first and the second main layers. For example, the electrically insulating material may be provided as a layer between the first and the second main layers. The electrically insulating material may for example be present at any fraction of the area between the first and the second main layers not occupied by the light emitting layer. The fraction of the area between the first and the second main layers not occupied by the light emitting unit, e.g. by the light emitting layer, may be in the range of 10% and up to 100%. The electrically insulating material may for example be an amorphous plastic material (e.g. polyvinylchloride, polycarbonate and polystyrene) or a crystalline plastic material (e.g. Nylon, polyethylene and polypropylene), wood, or another non-conducting material. The light emitting layer is generally thin, e.g. in the μm range or the nm range, and when the main layers are large, e.g. having dimension above 100 mm, the low distance between the main layers afforded by the light emitting layer creates a risk that the main layers bend toward each other thereby short-circuiting the light emitting device. It is especially preferred than when the main layers have dimensions above 100 mm, e.g. in the range of 100 mm to 1000 mm, the light emitting device contains a layer of an electrically insulating material between the first and the second main layer.

The light emitting layer and also the light emitting unit typically has a total thickness in the micrometre range. It may be desirable to increase the distance between the main layers to provide space for an electrically insulating material, and to avoid short circuiting. The light emitting device, e.g. the light emitting unit, may comprise a spacer material, e.g. between the light emitting layer and first or the second main layer, or as part of the light emitting unit. A spacer material may be located along the edge, e.g. along 20% to 100% of the edge, of the light exit orifice, or an area of a main layer having a plurality of light exit orifices. It is especially preferred that the spacer material is electrically conducting. For example, the spacer material may be a metal, which may be gold or platinum or be coated with gold or platinum. When a spacer material is included, a larger distance between the main layers is possible, which in turn allows a thicker layer of electrically insulating material, e.g. a layer of electrically insulating material at 50% to 100% of the area not occupied by the light emitting unit and/or the light emitting layer. Having a thicker layer of electrically insulating material improves the structural stability of the light emitting device. Thus, in an example, the light emitting device, e.g. the light emitting unit, comprises a spacer material, especially made of a conducting metal, and an electrically insulating material having a thickness in the range of 100 μm to 2 mm.

In general, the shorter the distance from the centre point to the edge of the light exit orifice, the stronger the light emitted by the light emitting layer, as it allows for a more uniform electric field to pass through the light emitting layer. The light exit orifice may be defined to have a smallest dimension of at least 0.1 mm, e.g. 0.2 mm, in the surface, e.g. the outer surface, of the main layer having the light exit orifice. In general, the smallest dimension may be up to 10 mm, e.g. up to 5 mm. Thus, the smallest dimension of the light exit orifice may be in the range of 0.1 mm to 10 mm, e.g. 0.2 mm to 5 mm or 0.2 mm to 2 mm. It is especially preferred that the minimum distance from the centre point or centre line to the edge of the light exit orifice is in the range of 0.1 mm to 5 mm. A centre line is relevant when the light exit orifice has the shape of a partial or full perimeter of a geometric figure, e.g. a circle, an oval, a polygon, a star, etc. In particular, a centre line has a minimum distance to the edge of the light exit orifice. The minimum distance from a centre line to the edge of the light exit orifice may be the same or different over the length of the light exit orifice, e.g. the length of the light exit orifice in the outer surface of the main layer having the light exit orifice. In a specific example, the light exit orifice has the shape of a line with a width representing the smallest dimension. For example, the light exit orifice may have the shape of a line with a width in the range of 0.1 mm to 5 mm, e.g. 0.2 mm to 2 mm, and a length of up to 100 mm. The minimal distance from the centre point to the edge of the light exit orifice may be defined at a single point, although it is preferred that the distance from the centre point is in the range of 0.1 mm to 5 mm, e.g. 0.2 mm to 2 mm, to at least 25%, e.g. at least 30%, or at least 50% of the edge of the light exit orifice. The light exit orifice may have any shape desirable. Furthermore, for certain shapes of the light exit orifice there may be more than one centre point, e.g. a centre line, for which a minimal distance to the edge of the light exit orifice can be defined. For example, the light exit orifice may be circular, so there is one centre point which has the same distance to the edge of the light exit orifice, e.g. the distance is the same for 100% of the edge of the light exit orifice. The light exit orifice may be elliptical, e.g. the light exit orifice has two centre points, rectangular, square, polygonal, star-shaped, etc. The light exit orifice may be defined by an axial length dimension and a transverse length dimension in the surface of the main layer comprising the light exit orifice. For example, the axial length dimension is normal to the transverse length dimension. In a specific example, the ratio between the axial length dimension and the transverse length dimension is in the range of 1:2 to 2:1. In a further specific example, the ratio between the axial length dimension and the transverse length dimension is in the range of 20:1 to 2:1, e.g. 10:1 to 5:1.

The light emitting unit may be formed as a diode, preferably the light emitting unit is formed as diode configured to emit light by impact ionisation. For example, the light emitting layer may comprise one or more of the following: $Mg_xZn_{1-x}O$, AlN, AlGaN, GaN, ZnO, $MgAl_2O_4$, boron nitride (BN), in particular, $Mg_xZn_{1-x}O$, wherein $0.6 \leq x \leq 1$, a single crystal of MgO, e.g. with a <111> crystal orientation, or a single crystal of MgO with a layer of $Mg_xZn_{1-x}O$, where $0.6 \leq x \leq 1$. Alternatively, the light emitting unit may be configured as a P-N junction diode or a Schottky diode. When the light emitting unit is configured to emit light by impact ionisation it is preferred that the light emitting device does not comprise an electric connection between the first and the second main layers, e.g. that the space between the first and the second main layers does not comprise an electric connection between the first and the second main layers. It is further preferred that the when the light emitting unit is configured to emit light by impact ionisation, the light emitting device further comprises an electrically insulating material between the first main layer and the second main layer at a fraction of the area between the first and the second main layers not occupied by the light emitting unit, which fraction is in the range of 10% and up to 100%, e.g. in the range of 50% to 100%.

The light emitting unit may be configured to emit light at any wavelength desired. The wavelength emitted may be selected by selection of the material and make-up of the light emitting layer. The wavelength may alternatively be controlled by modifying a voltage supplied to the light emitting unit. For example, the light emitting layer may be configured to emit visible light, UV light or infrared (IR) light. The visible light will generally be in the wavelengths of 380 nm to 700 nm. UV light will generally be in the wavelengths of 100 nm to 380 nm. IR light will generally be in the wavelengths of 700 nm to 1000 nm or higher. The light emitting unit may for example be configured to emit deep UV-C light, e.g. in the range of 100 nm to 280 nm. For example, the light emitting layer may comprise, in particular consist of, $Mg_xZn_{1-x}O$, wherein $0.6 \leq x \leq 1$, a single crystal of MgO, e.g. with a <111> crystal orientation, or a single crystal of MgO with a layer of $Mg_xZn_{1-x}O$, wherein $0.6 \leq x \leq 1$ The light emitting device may be connected to a power source providing power to the main layers. The power source may provide a direct current, e.g. a direct current at a constant voltage, to the main layers. The power source may alternatively provide an alternating current to the main layers. The frequency of the alternating current may be chosen freely. For example, the frequency of the alternating current may be in the range of 10 Hz to 10 MHz. The voltage of the direct current or the alternating current is selected to match the requirements of the light emitting layers. In a specific example, the light emitting device is configured to emit light by impact ionisation, e.g. the light emitting layer comprises or consists of a single crystal of MgO, a layer of $Mg_xZn_{1-x}O$ with $0.6 \leq x \leq 1$, or a single crystal of MgO with a layer of $Mg_xZn_{1-x}O$ with $0.6 \leq x \leq 1$, and the power supply is configured to provide an alternating current between the first main layer and the second main layer with a frequency in the range of 10 Hz to 10 MHz.

The first main layer and the second main layer are preferably configured to act as an anode and a cathode in a diode. The first main layer and the second main layer may each act as a terminal for the light emitting unit. When the light emitting unit is a P-N junction diode, the first main layer may be electrically connected to a n-type semiconductor, e.g. silicon doped with phosphorus or arsenic, and the second layer may be electrically connected to a p-type semiconductor, e.g. silicon doped with boron or gallium.

The light exit orifice may be configured to collimate light emitted by the light emitting layer to direct light in a desired direction. The light exit orifice may be formed to collimate light emitted into a light beam with a corresponding shape as the light exit orifice, e.g. when the light exit orifice is circular the light exit orifice may collimate emitted light to achieve a circular beam of light emitted from the light emitting device. For example, the first main layer and/or the second main layer may extend perpendicular to the light exit orifice to collimate light emitted from the light emitting layer. The first main layer and/or second main layer extending perpendicular to the light exit orifice corresponds to the first main layer and/or second main layer not tapering away from the light exit orifice. The effect may be especially pronounced for larger thicknesses of the main layers, e.g. a thickness above 10 mm. In an example, the light emitting device comprises additional material around or at the light exit orifice to increase the thickness and thereby improve collimation of the light emitted from the light emitting layer. Alternatively, or additionally, the first main layer and/or the second main layer may be provided with a taper away from the edge of the light exit orifice to achieve a higher spread of light from the light emitting device. The taper away from the edge of the light exit window may be between 0 degrees to 90 degrees, preferably, 10 degrees to 80 degrees, 20 degrees to 70 degrees, or 30 degrees to 60 degrees. For example, the light emitting device may be provided with a first light exit orifice configured to collimate light passing through the light exit orifice, and a second light exit orifice configured to spread light passing through the light exit orifice.

In a specific example, light emitted from the light emitting layer may be collimated when the first main layer and/or the second main layer comprises a plurality of light exit orifices aligned with a section of the light emitting layer, which light exit orifices are round or square and have dimensions in the range of 100 µm to 500 µm. In particular, the first main layer and/or the second main layer may comprise a plurality of light exit orifices aligned with a section of the light emitting layer, which light emitting layer has dimensions in the range of 10 mm to 50 mm, and which light exit orifices are round, square, or polygonal and have dimensions in the range of 100 µm to 500 µm, with a distance between each light exit orifice being in the range of 100 µm to 500 µm, and the total area of the light exit orifices in the main layer is in the range of 80% to 90% of the area of the light emitting layer.

In general, for any example where the light exit orifice or light exit orifices is/are configured to collimate the light, the light exit orifice has a length, e.g. corresponding to the thickness of the main layer in which the light exit orifice is located or to the thickness of the main layer in which the light exit orifice is located and additional material added to increase the length of the light exit orifice, and a cross-sectional dimension, e.g. a diameter, and the ratio between the length and cross-sectional dimension of the light exit orifice is in the range of 100:1 to 5:1.

The first main layer and/or the second main layer may comprise a plurality of light exit orifices. The plurality of light exit orifices may be arranged in a grid like fashion to facilitate a uniform light emission from the light emitting layer via the plurality of light exit orifices in the first main layer and/or in the second main layer. In an example, the first main layer and/or the second main layer comprises a plurality of light exit orifices aligned with a section of the light emitting layer. For example, the light emitting layer may have an area facing the main layer having the plurality of light exit orifices, and the total area of the light exit orifices in the main layer may be in the range of 20% to 90% of the area, e.g. the section, of the light emitting layer. Each light exit orifice may be round, square, or polygonal and have dimensions in the range of 0.2 mm to 2 mm, with a distance between each light exit orifice being in the range of 0.2 mm to 2 mm. When the distance between each light exit orifice is in the range of 0.2 mm to 2 mm, in particular, when each light exit orifice has dimensions in the range of 0.2 mm to 2 mm, a uniform electric field is generated over the section of the light emitting layer aligned with the plurality of light exit orifices. It is especially preferred that the first main layer and/or the second main layer comprises a plurality of light exit orifices aligned with a section of the light emitting layer, and that the light emitting layer has dimensions in the range of 10 mm to 50 mm, and that the light exit orifices are round, square, or polygonal and have dimensions in the range of 0.2 mm to 2 mm, with a distance between each light exit orifice being in the range of 0.2 mm to 2 mm, and that the total area of the light exit orifices in the main layer is in the range of 80% to 90% of the area of the light emitting layer.

It is especially preferred that the first and the second main layers are made from aluminium, magnesium, or titanium, e.g. plates of aluminium, magnesium, or titanium, having thicknesses in the range of 0.5 mm to 5 mm, e.g. 1 mm to 3 mm, and that the smallest dimension of the light exit orifice, e.g. the distance from the centre point, is in the range of 0.1 mm to 5 mm, e.g. 0.2 mm to 2 mm, to at least 25%, e.g. at least 30%, or at least 50% of the edge of the light exit orifice. For this example, the light intensity of light emitted from the light emitting layer is uniform over the surface of the light emitting layer at the light exit orifice.

In a further example, the axial length dimension and the transverse length dimension of the light exit orifice in the surface of the main layer housing the light exit orifice are in the range of 1 mm to 5 mm, and in a specific example, the axial length dimension is in the range is in the range of 2 mm to 20 mm, and the transverse length dimension is in the range is in the range of 1 mm to 2 mm. In these examples, the main layer comprising the light exit orifice may further comprise a metallic wire, e.g. a metallic wire with a thickness in the range of 10 µm to 500 µm, e.g. 50 µm to 250 µm, across the light exit orifice and electrically connected at two sites in the edge of the light exit orifice. The metallic wire facilitates that a uniform electric field is generated over the section of the light emitting layer aligned with the light exit orifice. The metallic wire improves emission of light by impact ionisation, thereby allowing the light exit orifice to have a larger area in the corresponding main layer than when no metallic wires are present.

It is especially preferred that the light exit orifice comprises a plurality of metallic wires across the light exit orifice and each electrically connected at two sites in the edge of the light exit orifice. A plurality of wires may be substantially parallel or arranged in a pattern where the metallic wires cross each other, but in general, the distance between the metallic wires may be in the range of 100 µm to 2 mm, e.g. 200 µm to 1 mm, especially when the metallic wires have a thickness in the range of 50 µm to 250 µm. Preferred metals for the metallic wires are conducting metals, in particular gold, platinum, aluminium and copper. It is especially preferred that when the metallic wire is another metal than gold or platinum, it is coated with gold or platinum.

A section of the light emitting layer is aligned with the light exit orifice, and this section may constitute 10% to 95% of the light emitting layer, e.g. 20% to 90%, or 30% to 80%. The part of the light emitting layer not aligned with light exit orifice may contribute to light emitted from the light exit orifice, e.g. by reflection of other layers, e.g. the first main layer or second main layer or by scattering.

In general, the light emitting device may be described in terms of the electric field applied over the light emitting unit. For example, an electric field may exist between the first main layer and the second main layer. The electric field may be in the range of 0.1 MV/cm to 10 MV/cm. The unit "MV/cm" may also be described as $10^6$ V/cm. Thus, electric field may be in the range of $10^5$ V/cm to $10^7$ V/cm. The electric field may be calculated by dividing the voltage applied to the light emitting device with the thickness of the light emitting unit, e.g. the thickness of the light emitting layer. Preferably, the light emitting layer has a thickness of 100 nm to 1 µm, e.g. 100 nm to 500 nm, or 400 nm to 1 µm. The thickness of the light emitting layer may be chosen in accordance with a voltage to be sent through the first main layer and the second main layer, and/or a thickness of the light emitting unit. For example, when a high voltage is used, e.g. 100 V to 200 V, the thickness of the light emitting layer may be large, e.g. in the range of 400 nm to 1 µm, as a high voltage gives rise to a larger electrical field, e.g. the electric is in the range of 1 MV/cm to 5 MV/cm. Having a thick light emitting layer, e.g. 400 nm to 1 µm, can increase the intensity of light emitted from the light emitting layer. In another example, where a low voltage is used, e.g. 30 V to 50 V, the thickness of the light emitting layer may be small, e.g. in the range of 100 nm to 500 nm, or 100 nm to 400 nm, as a low voltage gives rise to an electrical field in the range of 1 MV/cm to 3 MV/cm. Using a low voltage can increase the safety of handling and being around the light emitting device, as the risk of being shocked is reduced.

The light emitting device may comprise a converter for amplifying a voltage through the light emitting unit. In examples, wherein the light emitting layer has a large thickness, e.g. above 1 µm, high voltages, e.g. 200 V to 1000 V, may be needed to achieve a desired intensity of light emitted from the light emitting layer. However, running such high voltages through the main layers may pose a risk for a person in the near vicinity of the main layers, thus to minimise the risk while still achieving high voltages, the light emitting device may comprise a converter for amplifying a voltage through the light emitting unit. The converter may be configured for converting a low voltage, e.g. 12 V to 50 V, into a high voltage, e.g. 200 V to 1000 V. The converter may comprise an electrical probe for delivering an electrical current to the light emitting unit. It is particularly relevant for the light emitting device to comprise a converter, when the light emitting unit is configured to emit light by impact ionisation. For example, the light emitting device may comprise a converter when the light emitting layer comprises one or more of the following: $Mg_xZn_{1-x}O$, AlN, AlGaN, GaN, ZnO, $MgAl_2O_4$, boron nitride (BN), MgO, in particular $Mg_xZn_{1-x}O$ when $x \geq 0.6$, preferably $x \geq 0.8$, e.g. when the light emitting device is configured to emit light by impact ionisation. In an example, the light emitting layer has a thickness above 1 µm, e.g. in the range of 1 µm to 5 µm, which light emitting layer comprises $Mg_xZn_{1-x}O$, and the light emitting device comprises a converter, in particular a converter configured for converting a low voltage, e.g. 12 V to 50 V, into a high voltage, e.g. 200 V to 1000 V.

The light emitting layer may comprise a plurality of different compounds. The light emitting layer may comprises one or more of the following: $Mg_xZn_{1-x}O$, AlN, AlGaN, GaN, ZnO, $MgAl_2O_4$, BN, MgO, where $0 \leq x \leq 1$, in particular $0.6 \leq x \leq 1$. Preferably, the light emitting layer comprises $Mg_xZn_{1-x}O$ where $x \geq 0.6$, preferably $x \geq 0.8$. Recent studies have shown that $Mg_xZn_{1-x}O$ where $x \geq 0.6$, preferably $x \geq 0.8$, is capable of emitting deep UV-C light, 100 nm to 280 nm, cf. Ishii et al. 2019. The light emitting layer may be formed as a single compound layer. The light emitting layer may be doped with III-materials or V-materials to increase the hole or electron density of the light emitting layer. V-materials such as nitrogen, phosphorus, arsenic or antimony may be used for doping the light emitting layer. III-materials such as boron, aluminium, gallium or indium may be used for doping the light emitting layer. Doping the light emitting layer is advantageous when trying to modulate the electrical, optical and/or the structural properties of the light emitting layer. For example, by doping the light emitting layer the band structure may be modified, thus allowing for the modification of light emitted by the light emitting layer.

In a specific example, the light emitting layer comprises $Mg_xZn_{1-x}O$, where $0.6 \leq x \leq 1$, or $0.8 \leq x \leq 1$, and the light emitting layer has a thickness in the range of 100 nm to 500 nm, or 100 nm to 400 nm, and the light emitting device is configured to emit UV-C light by impact ionisation by being driven by a voltage in the range of 30 V to 50 V. In a further specific example, the light emitting layer may comprises $Mg_xZn_{1-x}O$, where $0.6 \leq x \leq 1$, or $0.8 \leq x \leq 1$, and the light emitting layer has a thickness in the range of 400 nm to 1 µm and is configured to emit UV-C light by impact ionisation by being driven by a voltage in the range of 100 V to 200 V. In both these examples, it is further preferred that the light emitting device comprises an electrically insulating material between the first main layer and the second main layer at a fraction of the area between the first and the second main layers not occupied by the light emitting unit, which fraction is in the range of 10% and up 100%. It is even more preferred that in these two examples, the light emitting layer has a surface from which light emitted from the light emitting layer exits the light emitting device via the light exit orifice, which surface in the light exit orifice has a centre point having a minimum distance to an edge of the light exit orifice in the range of 0.1 mm to 10 mm, e.g. the smallest dimension of the light exit orifice is in the range of 0.2 mm to 5 mm. The first main layer and/or the second main layer may in particular comprise a plurality of light exit orifices aligned with a section of the light emitting layer, the plurality of light exit orifices having total area in the range of 20% to 90% of the area of the light emitting layer, and further the light exit orifice may comprise a plurality of metallic wires across the light exit orifice, each electrically connected at two sites in the edge of the light exit orifice, the plurality of wires being substantially parallel or arranged in a pattern where the metallic wires cross each other.

In another specific example, the light emitting layer comprises MgO. For example, the light emitting layer may comprise a crystal of MgO. The light emitting layer may comprise single crystal MgO, e.g. with a crystal orientation of <111>. When the light emitting layer comprises MgO, e.g. a crystal of MgO or a single crystal MgO, the light emitting layer may have a dimension between the first main layer and the second main layer, e.g. a thickness, in the range of 1 µm to 1 mm, 100 µm to 900 µm, 300 µm to 500 µm, or around 400 µm. In particular, a crystal of MgO, e.g. a single crystal of MgO, may have a thickness in the range of 1 µm to 1 mm, 100 µm to 900 µm, 300 µm to 500 µm, or around 400 µm. Single crystal MgO may be provided as a wafer, which has been cut from a larger single-crystal of MgO. A wafer cut from a larger single-crystal typically has a thickness of 100 µm or more. Single-crystal MgO may also be grown as a film on a substrate. When a film is grown on a substrate, the film typically has a thickness less than 100 µm, e.g. about 10 µm or about 20 µm.

When the light emitting layer comprises MgO, e.g. a crystal of MgO or single-crystal MgO, the light emitting device is generally configured to emit UV-C light by impact ionisation by being driven by a voltage in the range of 30 V to 50 V or in the range of 100 V to 200 V. Surprisingly, the applicant has found that even though MgO has a bandgap of around 7.7 eV, corresponding to emission with a wavelength of about 161 nm, a crystal of MgO with a larger thickness, e.g. about 500 µm, emits UV-C light with a wavelength of about 220 nm. Without being bound by theory, this is thought to be the result of naturally occurring defects in the MgO crystal lattice, e.g. interstitial atoms, vacancy defects, etc. It is further contemplated that a crystal of MgO, e.g. a single-crystal MgO, may be doped with doping atoms to enhance the UV-C emission. Furthermore, MgO has a high transmittance for UV-C emission, thus even if a thicker layer of MgO is provided as the light emitting layer, the MgO still allows for the UV-C light to be transmitted through the MgO. Having a thicker light emitting layer, e.g. with a thickness above 1 µm, may improve the sturdiness of the light emitting layer, thus reducing the risk of the light emitting layer cracking or otherwise experiencing other structural defects. Having a thicker light emitting layer may assist in distancing the main layers from each other, thus minimizing risks of short circuits. Preferably, the light emitting layer comprises MgO, e.g. single-crystal MgO, with a crystal orientation of <111>. Other relevant crystal orientations include <100>. The MgO layer may be provided by a mono-crystalline wafer. It is further preferred that the light emitting device comprises an electrically insulating material between the first main layer and the second main layer at a fraction of the area between the first and the second main layers not occupied by the light emitting unit, which fraction is in the range of 10% and up 100%. It is even more preferred that the light emitting layer has a surface from which light emitted from the light emitting layer exits the light emitting device via the light exit orifice, which surface in the light exit orifice has a centre point having a minimum distance to an edge of the light exit orifice in the range of 0.1 mm to 5 mm. The first main layer and/or the second main layer may in particular comprise a plurality of light exit orifices aligned with a section of the light emitting layer, the plurality of light exit orifices having total area in the range of 20% to 90% of the area of the light emitting layer, and further the light exit orifice comprises plurality of metallic wires across the light exit orifice, each electrically connected at two sites in the edge of the light exit orifice, the plurality of wires being substantially parallel or arranged in a pattern where the metallic wires cross each other.

In general, any layer may be manufactured using any available technology as desired. Exemplary process types include a sputtering process, a chemical vapour deposition (CVD) process, a metal organic chemical vapour deposition (MOCVD) process, atomic layer deposition (ALD) process, or an e-beam deposition process. It is also considered to employ the different processes sequentially, e.g. CVD followed by ALD, etc. Any of these processes may be employed to grow a crystalline film, in particular a crystal film of MgO, e.g. of [111] orientation, on a substrate.

In an example the light emitting unit further comprises a first dielectric layer arranged between the first main layer and the light emitting layer. The first dielectric layer may act as a growth substrate for the light emitting layer. The first dielectric layer may act as growth substrate in a sputtering process, a CVD process, a MOCVD process, an ALD process, or an e-beam deposition process where the light emitting layer is grown on the first dielectric layer. The first dielectric layer may be formed by a sputtering process, a CVD process, a MOCVD process, and ALD process, or an e-beam deposition process. The first dielectric layer may be formed directly on the first main layer, alternatively the first dielectric layer is formed on an intermediate layer arranged in-between the first main layer and the first dielectric layer. The use of an intermediate layer is advantageous when the inherent surface roughness of the main layer is too large, e.g. the inherent surface roughness of the main layer may not allow for a high quality dielectric to be deposited, e.g. the main layer having a surface roughness of above 500 nm, thus the intermediate layer may be configured to deposited on the rough surface of the main layer while providing a smoother surface for the dielectric layer, e.g. a surface roughness below 500 nm.

The first dielectric layer may be formed by an oxide layer formed on the first main layer, e.g. when the first main layer is made from aluminium, magnesium, or titanium, the natural oxide layer formed on these may act as the first dielectric layer. The first dielectric layer may be grown by an oxidation process, wherein the first main layer is oxidised. The first dielectric layer preferably being made from $Al_2O_3$, $TiO_2$, and/or MgO. For example, the first main layer may be made from aluminium, titanium or magnesium that is subsequently anodised to provide the dielectric layer.

The light emitting device may comprise MgO, which may be present in the light emitting layer where the MgO, e.g. as a single crystal described with an orientation, such as <111> orientation, provides UV light, especially UV-C light, or MgO may be present as a dielectric component in a dielectric layer. As a dielectric component, MgO may be described to have an orientation denoted "[111]". In the present context, an orientation denoted with "< >", e.g. as "<111>", refers to a single crystal having the indicated orientation, and an orientation denoted with "[ ]", e.g. as "[111]", refers to a highly oriented material, e.g. a film, which is crystal-like but is not a single crystal. Single crystal materials, including MgO, are typically manufactured according to the Czochralski method or in a float-zone method. Both of the Czochralski method and the float-zone method are well-known to the skilled person, who can select one of the methods for providing an MgO single crystal. A single crystal, e.g. as provided in the Czochralski method, is typically cut into wafers, which may be applied directly, or which may be modified further before application in the light emitting device. In general, single crystal MgO, e.g. a single crystal MgO provided from a wafer of single crystal MgO, generally has a dimension between the first main layer and the second main layer, e.g. a thickness in the range of 100 μm to 900 μm, and a film of MgO, e.g. as provided using the electron beam evaporation technique disclosed in U.S. Pat. No. 9,856,578 B2, generally has a thickness of up to 10 μm. Thus, the first dielectric layer may be an MgO film with an orientation of [111]. In U.S. Pat. No. 9,856,578 B2 a method for producing an MgO film with an orientation of [111] is disclosed. The contents of U.S. Pat. No. 9,856,578 B2 are hereby incorporated by reference. An MgO film, e.g. with an orientation of [111], is advantageous when $Mg_xZn_{1-x}O$ is used for the light emitting layer, as the MgO film may act as a growth substrate for the $Mg_xZn_{1-x}O$. Furthermore, the MgO film has a cubic crystal structure while $Mg_xZn_{1-x}O$ may also exhibit a cubic crystal structure for x>0.62, thus providing an optimal growth substrate for growing a high-quality light emitting layer, with minimal lattice defects. However, it is also contemplated that a layer of $Mg_xZn_{1-x}O$ is grown on a single crystal of MgO, e.g. provided from a wafer of single crystal MgO, which likewise provides an appropriate substrate for growth of $Mg_xZn_{1-x}O$. When $Mg_xZn_{1-x}O$ is grown on a single crystal of MgO, e.g. with an orientation of <111>, the light emitting layer is considered to include the single crystal of MgO and the further layer of $Mg_xZn_{1-x}O$. Preferably, the first dielectric layer has a thickness of 100 nm to 500 nm when a low voltage, e.g. 30 V to 50 V is to be applied to the main layers. Preferably, the first dielectric layer has a thickness of 500 nm to 3 μm when a high voltage, e.g. 100 V to 200V is to be applied to the main layers.

In an example the light emitting unit further comprises a second dielectric layer arranged between the second main layer and the light emitting layer. The second dielectric layer may act as a growth substrate for the light emitting layer. For example, the second dielectric layer may act as growth substrate in a sputtering process, a CVD process, a MOCVD process, an ALD process, or an e-beam deposition process where the light emitting layer is grown on the second dielectric layer. The second dielectric layer may be formed by a sputtering process, a CVD process, a MOCVD process, an ALD process, or an e-beam deposition process. The second dielectric layer is preferably formed directly on the second main layer, alternatively the second dielectric layer is formed on an intermediate layer arranged in-between the second main layer and the second dielectric layer. In another example the second dielectric layer may be formed by an oxide layer formed on the second main layer, e.g. when the second main layer is made from aluminium, magnesium, or titanium, the natural oxide layer formed on these may act as the second dielectric layer. In some examples, the second dielectric layer is grown by an oxidation process, wherein the second main layer is oxidized. For example, the second main layer may be made from aluminium, titanium or magnesium that is subsequently anodised to provide the second dielectric layer. The second dielectric layer is preferably being made from $Al_2O_3$, $TiO_2$, and/or MgO. Preferably, the second dielectric layer has a thickness of 25 nm to 200 nm when a low voltage, e.g. 30 V to 50 V is to be applied to the main layers. Preferably, the second dielectric layer has a thickness of 100 nm to 1 μm when a high voltage, e.g. 100 V to 200 V is to be applied to the main layers.

In some examples the light emitting unit comprises a first dielectric layer arranged between the first main layer and the light emitting layer and a second dielectric layer arranged between the second main layer and the light emitting layer. Consequently, a simple structure for achieving a diode able to emit light by impact ionisation is achieved. It is especially preferred that both the first main layer and the second main layer are made from aluminium, titanium or magnesium that is subsequently anodised to provide the dielectric layer. Alternatively, one dielectric layer may be provided by anodising one of the main layers, while the dielectric layer may be provided by depositing it on the other main layer. The material of the first main layer and the second main layer may be the same or different.

In an example the light emitting unit further comprises a transparent intermediary layer aligned with the light exit orifice and arranged between the light emitting layer and the first main layer or between the light emitting layer and the second main layer. Consequently, light is able to be emitted through the light exit orifice while the light emitting layer is shielded from contaminants entering through the light exit orifice. Preferably, the transparent intermediary layer extends so to fully shield the light emitting unit from contaminants entering through the light exit orifice. Preferably, the transparent intermediary layer is formed from a transparent conductive oxide, such as InSnO, $Al_2O_4Zn$ (AZO), or $CaF_2$. AZO is advantageous when the second main layer is made from aluminium, as AZO may then be formed by depositing ZnO on the second main layer and relying on the aluminium from the second main layer to react with the ZnO to create AZO. InSnO is advantageous when the light emitting layer emits deep UV-C light, as InSnO exhibits a high transmission rate for deep UV-C light. $CaF_2$ is advantageous when the light emitting layer emits deep UV-C light, as $CaF_2$ exhibits a high transmission rate for deep UV-C light. Alternatively, the transparent intermediary layer may be formed by a metal layer with a thickness of 2 nm to 10 nm, and wherein the metal layer comprises a metal, such as Au or Pt. Having the metal layer with only a thickness of 2 nm to 10 nm allows for the metal layer to be transparent. Having the transparent intermediary layer formed from a conductive material is advantageous when the light emitting unit is configured to emit light by impact ionisation, as the transparent intermediary layer may act to guide an electrical field over the light emitting layer. Furthermore, the transparent intermediary layer may act as an intermediate layer upon which a dielectric layer may be grown or deposited, e.g. the second dielectric layer may be grown or deposited on the transparent intermediary layer. The transparent intermediary layer may provide a smooth surface for the second dielectric material to be grown or deposited on. The transparent intermediary layer may be formed by a sputtering process, a CVD process, a MOCVD process, an ALD process, or an e-beam deposition process. It is also possible to provide the transparent intermediary layer in the second main layer by removal of material from the main layer to provide the desired thickness. Material may be removed by any appropriate technology, for example laser ablation, micromachining, chemical etching, or reactive ion etching.

The transparent intermediary layer is not necessary for the functioning of the light emitting device, and in a specific example, the light emitting device does not comprise a transparent intermediary layer.

In another example, a transparent cover layer is aligned with the light exit orifice and arranged above the main layer having the light exit orifice. For example, the transparent cover layer may cover the light exit orifice. The transparent cover layer may be larger than the light exit orifice, e.g. any section of the area of the main layer having the light exit orifice may be covered with the transparent cover layer. The material of the transparent cover layer is chosen to be transparent to the wavelength of light emitted by the light emitting layer. Exemplary materials for the transparent cover layer are polymers and glasses.

In an example a metallic contact layer for contacting the first main layer is contained in the light emitting device. The light emitting device may further comprise a metallic contact layer for contacting the second main layer. The light emitting layer may be formed directly on the metallic contact layer for contacting the first layer. The light emitting layer may be formed directly on the metallic contact layer for contacting the second layer. In an embodiment where the light emitting device comprises a first metallic contact layer for contacting the first main layer and a second metallic contact layer for contacting the second main layer, the light emitting layer may be in contact with the first metallic layer and the second metallic layer. The metallic contact layer may be made from any metal, in particular gold, platinum, copper, nickel, titanium and/or aluminium. The metallic contact layer may be a titanium or nickel film with a silver or gold film arranged on top of it. The metallic contact layer may act to guide an electrical field over the light emitting layer, this is advantageous when the light emitting unit is configured to emit light by impact ionisation. Furthermore, the metallic contact layer may act as an intermediate layer upon which a dielectric layer may be grown or deposited, e.g. the first dielectric layer may be grown or deposited on the metallic layer. The metallic layer may be formed by a sputtering process, a CVD process, a MOCVD process, an ALD process, or an e-beam deposition process. The metallic contact layer may have a thickness of 10 nm to 1 μm. Preferably, the metallic contact layer is configured to reflect light emitted by the light emitting layer towards the light exit orifice.

Preferably, the light emitting unit is formed directly on the first main layer and/or the second main layer. By forming the light emitting unit directly on the first main layer and/or the second main layer allows for the light emitting unit to be integrally formed with the main layers. Furthermore, having the light emitting unit integrally formed with the main layer reduces the needed space required for the light emitting unit, when comparing it to other methods of connecting a light emitting unit, such as a light fixture or similar. In an example the light emitting unit is formed on either the first main layer or the second main layer and connected to other main layer, e.g. the light emitting unit being formed on the first main layer and connected to the second main layer or vice versa. Alternatively, the light emitting unit may partly be formed on the first main layer and partly on the second main layer and subsequently be connected. The light emitting unit may in particular be formed directly on the main layers, by a sputtering process, a CVD process, a MOCVD process, an ALD process, an e-beam deposition process or a combination of these. The light emitting unit may connected to a main layer by bonding processes, such as direct bonding, or fusion bonding. The light emitting unit may be connected to a main layer by mechanical contacting, or adhesives. In examples where the light emitting unit is formed partly on the first main layer and partly on the second main layer, the parts of the light emitting unit may be connected by bonding processes, such as direct bonding, or fusion bonding, alternatively by mechanical contacting, or adhesives.

In a specific example, the first and the second main layers are made from metal, e.g. aluminium, magnesium, or titanium, e.g. plates of aluminium, magnesium, or titanium, and have thicknesses in the range of 0.5 mm to 5 mm, e.g. 1 mm to 3 mm. The light exit orifice may be provided in the metal using any procedure as desired. For example, the light exit orifice may be created in the metal using drilling, machining, laser ablation or etching. The light exit orifice in the metal preferably has a smallest dimension in the range of 0.1 mm to 10 mm, e.g. 0.2 mm to 5 mm, e.g. 1 mm to 2 mm. For example, the light exit orifice may be a trench in the like in the outer surface of the main layer having the light exit orifice, which trench has a width in the range of 0.5 mm to 2 mm, i.e. the smallest dimension of the light exit orifice is in the range of 0.5 mm to 2 mm. The main layer may have one or more, especially a plurality, of light exit orifices so that the total area of the light exit orifices is in the range of 20% to 90% of the area of the light emitting layer. In particular, the light emitting unit may comprise a first, and optionally also a second, dielectric layer arranged between the first main layer and the light emitting unit and between the second main layer and the light emitting layer, respectively. The dielectric layer is preferably MgO, e.g. MgO in a [111] orientation, and the light emitting layer is preferably $Mg_xZn_{1-x}O$ with $0.6 \leq x \leq 1$, e.g. $0.8 \leq x \leq 1$. For example, the first and the second dielectric layers, e.g. MgO in a [111] orientation, may have thicknesses in the range of the 100 nm to 500 nm. The light emitting layer, e.g. $Mg_xZn_{1-x}O$ with $0.6 \leq x \leq 1$, e.g. $0.8 \leq x \leq 1$, may have a thickness in the range of the 100 nm to 500 nm. The light emitting device may comprise a power supply configures to provide a voltage between the first main layer and the second main layer in the range of 30 V to 50 V or 100 V to 200 V. The power supply may in particular provide an alternating current, e.g. at a frequency in the range of 10 Hz to 10 MHz, e.g. 100 Hz to 1 MHz, between the first main layer and the second main layer.

In an example the light emitting device forms a construction element. In order to provide a construction element, each of the main layers should have a thickness of at least 1 mm, e.g. be in the range of 1 mm to 5 mm, and the main layers are preferably made from metals, e.g. aluminium, magnesium, or titanium, and the light emitting device should contain a layer of an electrically insulating material, e.g. a polymer. It is further preferred that the light emitting device, or the light emitting unit, comprises a spacer, especially a spacer of an electrically conducting metal, as defined above and that a layer of an electrically insulating material having a thickness in the range of 100 µm to 2 mm is included in the light emitting device.

The light emitting device may for example be used in constructing an air duct, where an air flow through the air duct is desired to be sterilised by UV light. The dimensions of the light emitting device may be selected freely. The dimensions may freely be selected to match the requirements needed. For example, the light emitting device, may have a width in the range of 10 cm to 125 cm, e.g. 25 cm to 100 cm, and a length in the range of 10 cm to 500 cm. In general, the light emitting has a thickness reflecting the thickness of the main layers and the light emitting unit. The thickness of the light emitting device is typically in the range of 2 mm to 50 mm. For example, the light emitting device may be sized to fit under e.g. a kitchen cabinet or the like. Thus, the light emitting device may have a width of about 600 mm.

The light emitting device may be extending in two dimensions so that it can be described as "planar". A planar light emitting device is not limited with respect to thickness, and in general the thickness is defined by the combined thicknesses of the main layers and the light emitting unit. The light emitting device may also be defined in three dimensions and e.g. have a shape representing a section of a sphere, e.g. a hemispherical shape, or an arch. A non-planar light emitting device also has a thickness as defined by the combined thicknesses of the main layers and the light emitting unit, and a non-planar composite board is also not limited with respect to its thickness.

In an example the main layers have been extruded from a metal, e.g. from aluminium, magnesium, copper, titanium, or steel. In a specific example either the first main layer and/or the second main layer are formed with trenches in the extrusion process. For example, the trenches may be present along a longitudinal axis of the respective layer through the length of the layer. The trenches may be employed to connect two light emitting devices to each other, e.g. using a connector pin providing electrical connection between the first main layer of one light emitting device with the first main layer of another light emitting device and between the second main layer of one light emitting device with the second main layer of another light emitting device. Connection of separate light emitting devices having trenches is disclosed in WO 2017/121430, the contents of which are hereby incorporated by reference. It is also possible to connect a light emitting device with an extension module as disclosed in WO 2018/077359, the contents of which are hereby incorporated by reference.

The light emitting device may further comprise a casing of an electrically insulating material preventing direct contact from a user with the electrically conducting main layers. The electrically conducting main layer may be made from anodised metals, e.g. anodised aluminium, magnesium, or titanium, so that the electrically conducting main layers have an insulating outer layer of the corresponding oxide. An anodised metal is generally considered to protect a user from voltages in the range of 30 V to 50 V. However, the light emitting device may be encased in an electrically insulating material with appropriate openings for electrical connections to the main layers and for the light emitted from the light emitting layer. In a specific example, the light emitting device is encased in a polymer, ceramic material or other electrically insulating material, and the light exit orifice is covered with a material transparent to light emitted by the light emitting layer. For example, the light emitting layer may be configured to emit light by impact ionisation and to be driven by a high voltage, e.g. in the range of 100 V to 200 V, and provide UV-C light. When the light emitting layer is configured to be driven by a high voltage, it is especially preferred that the light emitting device is encased in an electrically insulating material and further that the light emitting device comprises connections, e.g. trenches and corresponding connection pins, as disclosed in WO 2017/121430. Thereby, a light emitting device, especially a powerful UV-C lamp, is provided that can easily be used, in particular the light emitting device can easily be connected, replaced, etc., in a power supply system. Thus, the present invention provides a UV-C lamp for easy integration in a system at a setting, e.g. a hospital, where sterility is important.

It is noted that the invention relates to all possible combinations of features recited in the claims. Other objectives, features, and advantages of the present inventive concept will appear from the following detailed disclosure, from the attached claims as well as from the drawings. A feature described in relation to one of the aspects may also be incorporated in the other aspect, and the advantage of the feature is applicable to all aspects in which it is incorporated.

BRIEF DESCRIPTION OF THE DRAWINGS

In the following the invention will be explained in greater detail with the aid of an example and with reference to the schematic drawings, in which.

Figures 1, 2:
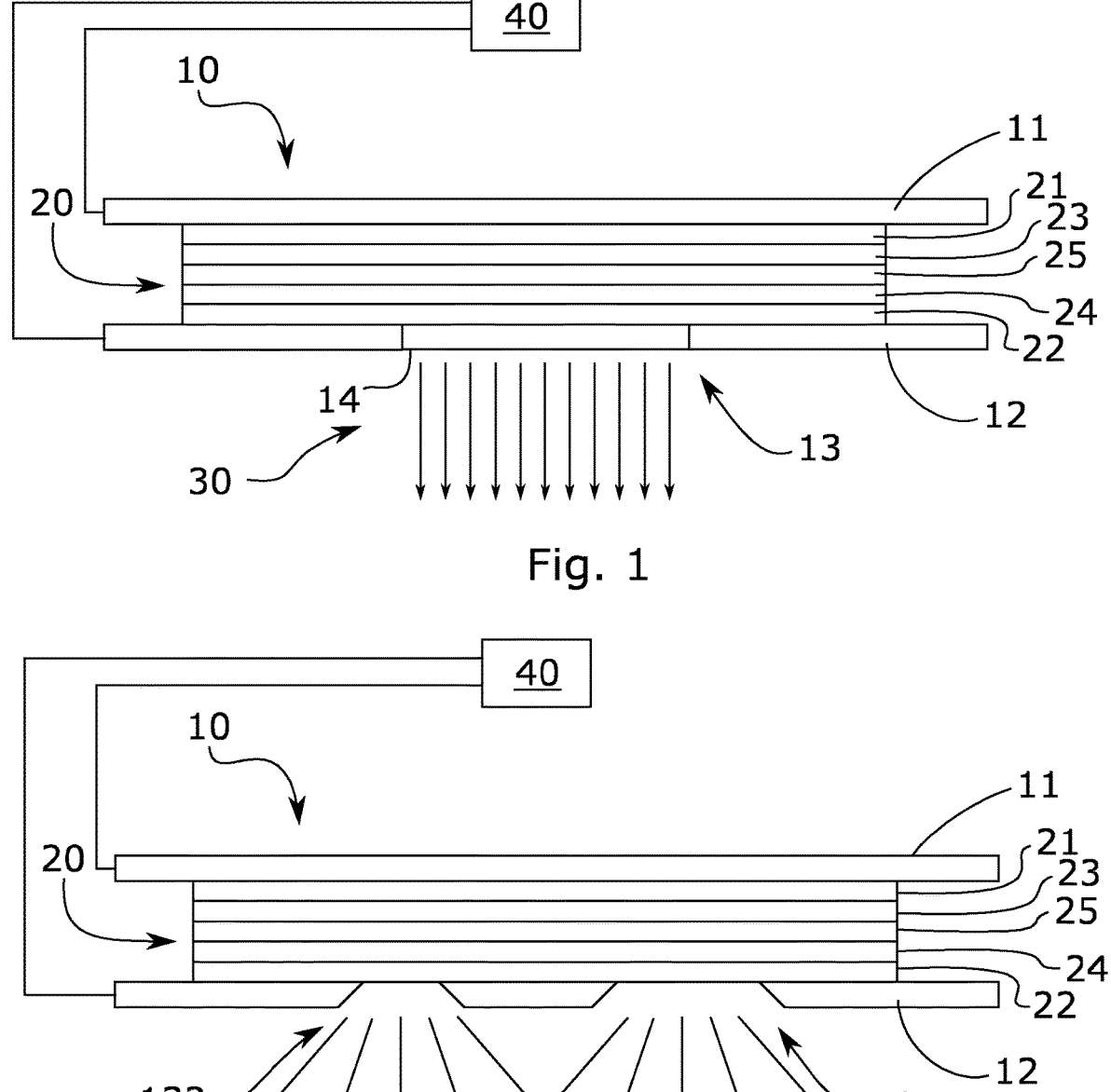
FIG. 1 depicts a schematic cross-sectional view of a specific example of a light emitting device according to the invention.
FIG. 2 depicts a schematic cross-sectional view of another specific example of a light emitting device according to the invention.

The invention is not limited to the embodiment/s illustrated in the drawings. Accordingly, it should be understood that where features mentioned in the appended claims are followed by reference signs, such signs are included solely for the purpose of enhancing the intelligibility of the claims and are in no way limiting on the scope of the claims.

The term "comprising" as used in this specification and claims means "consisting at least in part of". When interpreting statements in this specification and claims which include the term "comprising", other features besides the features prefaced by this term in each statement can also be present. Related terms such as "comprise" and "comprised" are to be interpreted in a similar manner.

DETAILED DESCRIPTION

The present invention will now be described more fully hereinafter with reference to the accompanying drawings, in which examples of the invention are shown. This invention may, however, be embodied in many different forms and should not be construed as limited to the examples set forth herein; rather, these examples are provided for thoroughness and completeness, and fully convey the scope of the invention to the skilled person. It may also be noted that, for the sake of clarity, the dimensions of certain components illustrated in the drawings may differ from the corresponding dimensions in real-life implementations of the invention, for instance the different layers shown in the figures are not to scale as it would render the figures intelligible because of the variations in thickness between the different layers.

Referring initially to FIG. 1, showing a schematic cross-sectional view of a light emitting device 10 according to the invention. The light emitting device 10 comprises a first main layer 11 of an electrically conducting material, and a second main layer 12 of an electrically conducting material. The electrically conducting material is aluminium in the shown example. The first main layer and the second main layer have a thickness of 0.5 mm to 5 mm. A width of the first main layer is in the range of 10 cm to 125 cm, and a length is in the range of 10 cm to 500 cm. The first main layer 11 and the second main layer 12 are electrically connected to a power source 40. The power source 40 may be provided as an integral part of the light emitting device, alternatively the power source 40 may be provided as external component electrically connectable to the first main layer 11 and the second main layer 12. The power source 40 may be configured to deliver an electric current with a voltage of 30 V to 50 V to the first main layer 11 and the second main layer 12. Arranged in-between the first main layer 11 and the second main layer 12 is a light emitting unit 20. The light emitting unit 20 being configured to emit light 30. In the shown example, the light emitting unit 20 comprises a metallic contact layer 21 contacting the first main layer 11. The metallic contact layer 21 being electrically connected to the first main layer 12. The metallic contact layer 21 has a thickness of 25 nm to 500 nm. The metallic contact layer 21 may be manufactured from gold, platinum, aluminium, titanium or nickel. Arranged on the second main layer 12 is a transparent intermediary layer 22. In the shown example, the transparent intermediary layer 22 is made from a transparent conductive oxide, such as InSnO or AZO. The transparent intermediary layer 22 is in electrical contact with the second main layer 12. The transparent intermediary layer 22 has a thickness in the range of 25 nm to 100 nm. Arranged on the metallic contact layer 21 is a first dielectric layer 23. The first dielectric layer 23 being an MgO film with a crystal orientation of <111>. The first dielectric layer 23 has a thickness of 100 nm to 500 nm. Arranged on the transparent intermediary layer 22 is a second dielectric layer 24. The second dielectric layer 24 being made from $Al_2O_3$. The second dielectric layer 24 has a thickness in the range of 25 nm to 200 nm. Arranged in-between the first dielectric layer 23 and the second dielectric layer 24 is a light emitting layer 25. The light emitting layer 25 is made from $Mg_xZn_{1-x}O$, where x>0.6. The light emitting layer 25 has a thickness in the range of 100 nm to 500 nm. The light emitting layer 25 is configured to emit light in the UV-C range by impact ionisation.

During operation an electric current is applied to the first main layer 11 and the second main layer 12 by the power source 40 with either the first main layer 11 being the anode and the second main layer 12 being the cathode, or vice versa. The electric current is transported through the main layers 11, 12 and into the metallic contact layer 21 and the transparent intermediary layer 22. The electric current passing through the metallic contact layer 21 and the transparent intermediary layer 22 results in an electric field over the dielectric layers 23, 24 and the light emitting layer 25. The electric field results in charge carriers being accelerated. The charge carriers can relax through generation of electron-hole pairs. Such additionally generated charge carriers are again accelerated, generating more electron-hole pairs, etc. This leads to an avalanche effect with lots of excited carriers in the device, of which some relaxes through emission of photons. The photons emitted by the light emitting layer are emitted through a light exit orifice 13 in the second main layer 12. The light exit orifice 13 being aligned with a section of the light emitting layer 25. In the shown example the light exit orifice 13 is provided with a transparent cover 14 protecting the light emitting unit 20 from contaminants. The light exit orifice 13 extends perpendicular to the transparent intermediary layer 22. The light exit orifice 13 extending perpendicular to the transparent intermediary layer 22 results in a collimating effect of light emitted by the light emitting layer 25 through the light exit orifice 13. As shown, the light exit orifice 13 is square and has dimensions, i.e. in the surface of the second main layer 12, of 5 mm by 5 mm, although other dimensions are also possible.

The layers 21, 22, 23, 24, 25, of the light emitting unit 20 are formed by sputtering.

Referring to FIG. 2 showing a schematic cross-sectional view of another specific example of a light emitting device 10 according to the invention.

The light emitting unit 20 shown in FIG. 2, is identical to the light emitting unit shown on FIG. 1. The light emitting device 10 shown in FIG. 2, comprises a first light exit orifice 131 and a second light exit orifice 132. The first light exit orifice 131 and the second light exit orifice 132 each being aligned with different sections of the light emitting layer 25. In the shown example, the second main layer 12 tapers away from the edges of the first light exit orifice 131 and the second light exit orifice 132, i.e. an angle larger than 90 degrees is formed between the second main layer 12 and the first light exit orifice 131 and the second light exit orifice 132. The taper away from the edges of the first light exit orifice 131 and the second light exit orifice 132 allows for light 30 emitted from the light emitting device 10 to spread out over a larger area. The taper may be degrees 10 to 80 degrees. In the shown example, the light 30 emitted through the first light exit orifice 131 overlaps with light 30 emitted from the second light orifice 132, thus allowing the light emitting device 10 to provide an almost uniform spread of light 30.

Figure 3:
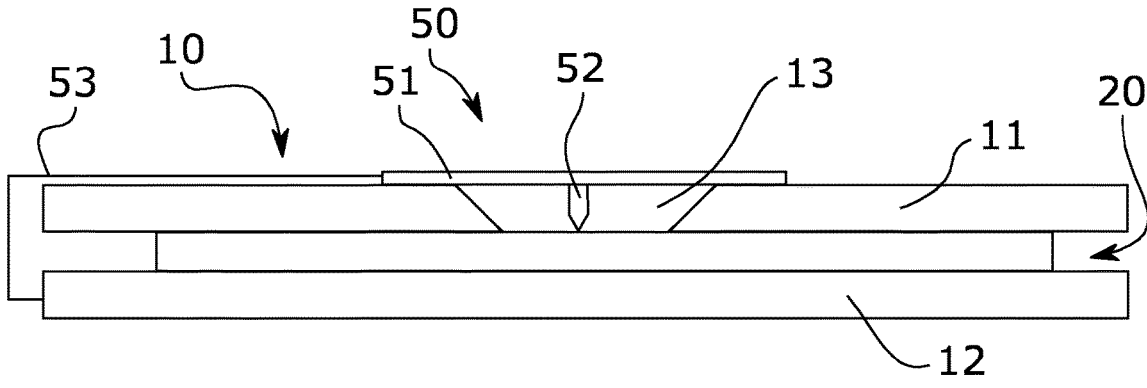
FIG. 3 depicts a schematic cross-sectional view of another specific example of a light emitting device comprising a converter according to the invention.

Referring to FIG. 3 showing a schematic cross-sectional of an example of a light emitting device 10 comprising a converter 50 according to the invention. The light emitting device 10 shown is similar to the light emitting devices 10 shown in FIGS. 1 and 2, however it differs in that the light emitting device 10 further comprises a converter 50. The converter 50 is provided with a base 51 electrically connected to a first main layer 11 and extending over a light exit orifice 13 formed in the first main layer 11. Extending from the base 51 towards the light emitting unit 20 is an electrical probe 52. The electrical probe 52 in the shown example extends through the light exit orifice 13. The electrical probe 52 being for delivering an electrical current to the light emitting unit 20. The converter 50 is grounded via being connected to the second main layer 12 via a wire 53. During operation a low voltage, e.g. 5 V, may be delivered to the converter 50 via the first main layer. The low voltage is amplified by the converter 50 to a high voltage, e.g. 1000 V, and delivered through the electrical probe 52 to the light emitting unit 20.

Example 1

A single-crystal MgO wafer of a thickness of 500 μm was provided to be used as a substrate for a layer of MgZnO. The single-crystal MgO was cut into appropriately sized pieces of 5 mm×5 mm. A population of the pieces were mounted between two layers of aluminium each having a thickness of 0.5 mm at a light exit orifice in one of the aluminium layers. Another population of the pieces of the MgO wafer were treated to provide a layer of MgZnO. Specifically, the MgZnO was formed on the MgO substrate in a vapour deposition process, by treatment at a temperature of 500° C. ("Sample 1") or 450° C. ("Sample 2") for a duration of one hour to thereby deposit a layer of MgZnO of 400 nm thickness on the MgO substrate. The samples including MgZnO were likewise mounted between two layers of aluminium, one of which having a light exit orifice. A high voltage was applied between the two layers of aluminium, and the samples were analysed for photo luminescence and Transmission Spectroscopy. The results are depicted in FIGS. 4 to 5.

Figure 4:
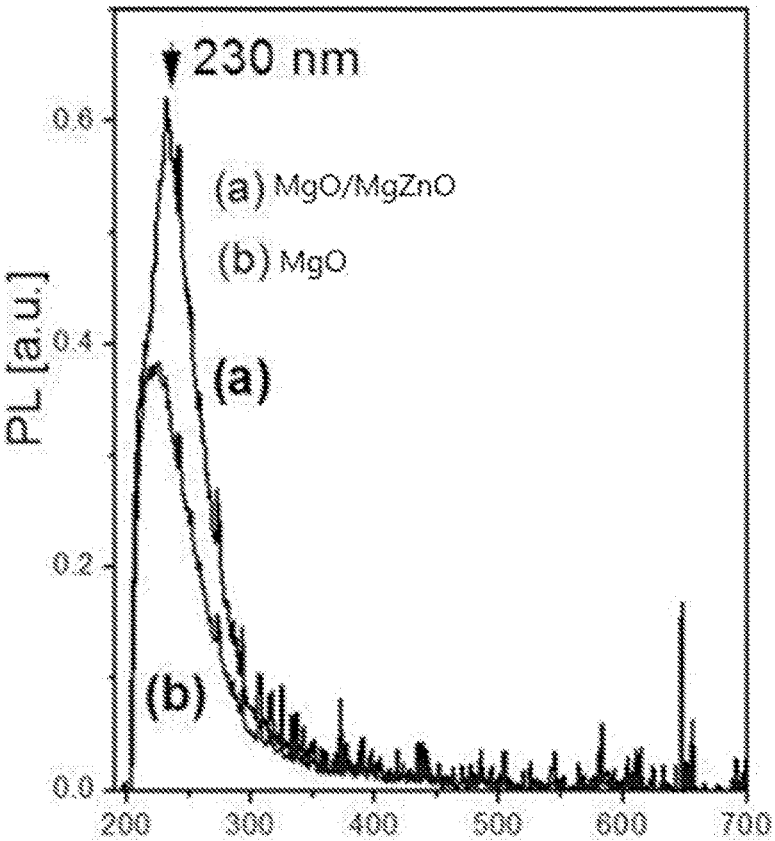
FIG. 4 depicts a graph showing the normalized intensities for the photoluminescence of a MgO sample, and a sample with MgZnO formed on a MgO substrate.

Referring to FIG. 4 showing a graph for the normalized intensities for the photoluminescence of a MgO sample, and a sample with MgZnO formed on a MgO substrate. The graph depicts two curves (a) and (b). The (a) curve corresponds to a 400 nm MgZnO film deposited on the MgO single crystal wafer The (b) curve corresponds to a single crystal MgO wafer with a thickness of 500 μm. From the curves, the samples are observed to both exhibit high photo luminescence at around 220 nm corresponding to far UV-C light. Surprisingly, the applicant has found that even though MgO has a bandgap of around 7.7 eV, corresponding to emission with a wavelength of about 161 nm, a crystal of MgO with a larger thickness, e.g. 500 μm, still emits UV-C light with a wavelength of about 220 nm.

Figure 5:
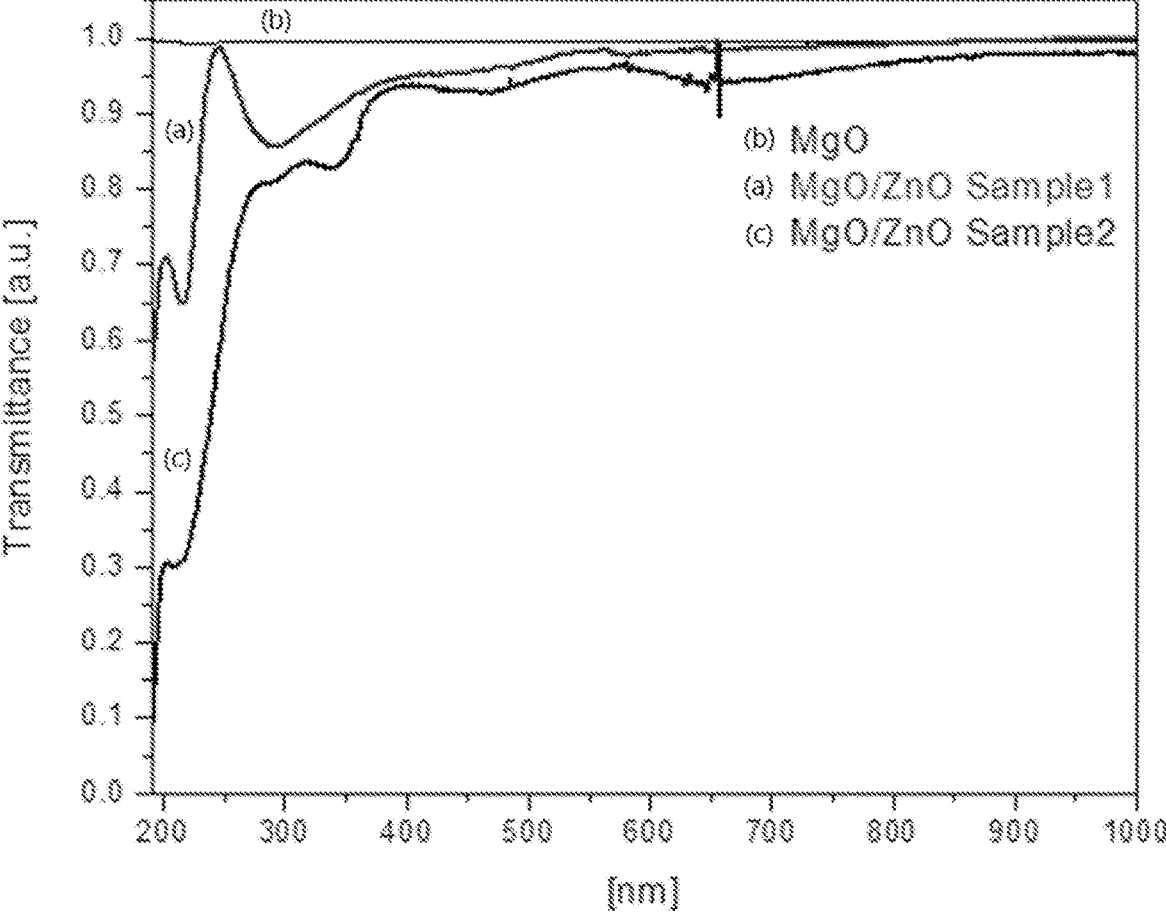
FIG. 5 depicts a graph showing the transmittances of a MgO sample, and two different samples with MgZnO formed on a MgO substrate.

Referring to FIG. 5 showing a graph for the normalized transmittances of the MgO sample, and two different samples with MgZnO formed on the MgO substrate. The single crystal MgO wafer is observed to have a high transmittance above 0.99 for wavelengths within the spectrum of 200 nm-1000 nm, whereas the samples having a layer of MgZnO have a lower transmission for wavelengths below 400 nm.

REFERENCE SIGNS LIST

10 light emitting device
11 first main layer
12 second main layer
13, 131, 132 light exit orifice
14 transparent cover
20 light emitting unit
21 metallic contact layer
22 transparent intermediary layer
23, 24 dielectric layers
25 light emitting layer
30 light
40 power source
50 converter
51 base
52 electrical probe
53 wire

What is claimed is:

1. A light emitting device comprising a first main layer of an electrically conducting material, a second main layer of an electrically conducting material and a light emitting unit between the first main layer and the second main layer, wherein the light emitting unit comprises a light emitting layer comprising a crystal of MgO with a crystal orientation of <111>, and wherein the first main layer or the second main layer has a light exit orifice aligned with a section of the light emitting layer.

2. The light emitting device according to claim 1, wherein the light emitting layer has a dimension between the first main layer and the second main layer in the range of 100 nm to 1 μm.

3. The light emitting device according to claim 1, wherein the crystal of MgO has a dimension between the first main layer and the second main layer in the range of 1 μm to 1 mm.

4. The light emitting device according to claim 3, wherein the light emitting unit further comprises a first dielectric layer arranged between the first main layer and the light emitting layer, or a second dielectric layer arranged between the second main layer and the light emitting layer.

5. The light emitting device according to claim 1, wherein the light emitting device does not comprise an electric connection between the first and the second main layers.

6. The light emitting device according to claim 3, wherein the light emitting unit further comprises a first dielectric layer arranged between the first main layer and the light emitting layer, which first dielectric layer comprises an MgO film, and which light emitting layer comprises $Mg_xZn_{1-x}O$, wherein $0.6 \leq x \leq 1$.

7. The light emitting device according to claim 1, wherein the first main layer or the second main layer is made from metal and has a thickness in the range of 0.5 mm to 5 mm.

8. The light emitting device according to claim 1, wherein a smallest dimension of the light exit orifice is in the range of 0.1 mm to 10 mm.

9. The light emitting device according to claim 1, further comprising a transparent intermediary layer aligned with the light exit orifice and arranged between the light emitting layer and the first main layer or between the light emitting layer and the second main layer.

10. The light emitting device according to claim 1, wherein the light emitting unit is configured to emit light by impact ionisation or wherein the light emitting unit is configured as a P-N junction diode or a Schottky diode.

11. The light emitting device according to claim 1, wherein the light emitting unit is formed directly on the first main layer or the second main layer.

12. The light emitting device according to claim 1, wherein the light emitting device forms a construction element.

13. The light emitting device according to claim 1, wherein the first main layer or the second main layer comprises a plurality of light exit orifices aligned with a section of the light emitting layer, the plurality of light exit orifices having a total area in the range of 20% to 90% of an area of the light emitting layer.

14. The light emitting device according to claim 1, wherein the light exit orifice is defined by an axial length dimension and a transverse length dimension in a surface of the main layer comprising the light exit orifice, and which axial length dimension and transverse length dimension are in the range of 1 mm to 5 mm, the light exit orifice comprising a metallic wire across the light exit orifice and electrically connected at two sites in an edge of the light exit orifice.

15. The light emitting device according to claim 1, wherein the light emitting device further comprises a converter for amplifying a voltage through the light emitting unit.

16. A method of producing a light emitting device, the method comprising the steps of providing a substrate comprising a first dielectric layer, selecting a deposition process from a list consisting of: chemical vapour deposition (CVD) process, metal organic chemical vapour deposition (MOCVD) process, atomic layer deposition (ALD) process, and e-beam deposition process, depositing a crystal of MgO <111>orientation on the substrate to provide a light emitting layer, providing a first main layer of an electrically conducting material and a second main layer of an electrically conducting material, positioning the light emitting layer between the first main layer and the second main layer, and providing the first main layer or the second main layer with a light exit orifice aligned with a section of the light emitting layer.

17. The method of claim 16, wherein the method further comprises providing a second dielectric layer, depositing a crystal of MgO <111>orientation on the second dielectric layer, and arranging the second dielectric layer between the second main layer and the light emitting layer.

* * * * *